(12) United States Patent
Weston et al.

(10) Patent No.: US 7,885,083 B2
(45) Date of Patent: Feb. 8, 2011

(54) INPUT TRANSIENT PROTECTION FOR ELECTRONIC DEVICES

(75) Inventors: Lance Weston, East Northport, NY (US); Edward L. Fontana, Hauppauge, NY (US); Larry A. Sternstein, Melville, NY (US)

(73) Assignee: Honeywell International, Inc., Morristown, NJ (US)

( * ) Notice: Subject to any disclaimer, the term of this patent is extended or adjusted under 35 U.S.C. 154(b) by 1013 days.

(21) Appl. No.: 10/750,385

(22) Filed: Dec. 31, 2003

(65) Prior Publication Data
US 2005/0139385 A1 Jun. 30, 2005

(51) Int. Cl.
*H05K 1/11* (2006.01)
*H05K 1/14* (2006.01)

(52) U.S. Cl. .................. 361/795; 361/761; 361/773; 361/782

(58) Field of Classification Search ......... 361/760–763, 361/795, 807, 810–812; 338/220–225
See application file for complete search history.

(56) References Cited

U.S. PATENT DOCUMENTS

| | | | | | |
|---|---|---|---|---|---|
| 4,883,920 | A | * | 11/1989 | Tanabe et al. | 174/263 |
| 5,461,049 | A | * | 10/1995 | O'Brien et al. | 514/210.2 |
| 5,552,757 | A | * | 9/1996 | Blecha et al. | 337/297 |
| 5,683,788 | A | * | 11/1997 | Dugan et al. | 428/209 |
| 5,933,307 | A | * | 8/1999 | West | 361/56 |
| 6,023,028 | A | * | 2/2000 | Neuhalfen | 174/250 |
| 6,337,798 | B1 | * | 1/2002 | Hailey et al. | 361/763 |
| 6,467,163 | B1 | * | 10/2002 | Laschinski | 29/836 |
| 6,690,558 | B1 | * | 2/2004 | Devoe et al. | 361/58 |
| 7,034,652 | B2 | * | 4/2006 | Whitney et al. | 338/223 |

* cited by examiner

*Primary Examiner*—Tuan T Dinh
(74) *Attorney, Agent, or Firm*—Robert S. Smith

(57) ABSTRACT

A circuit board assembly which includes an electrically insulating layer, a conductive printed wiring layer formed on the surface of the electrically insulating layer and includes a plurality of conductive paths, a conductive trace on the electrically insulating layer and apparatus for dissipating a transient in addition to a surface mount resistor fixed in relation to the trace. In some forms of the invention the surface mount resistor has opposed generally planar lips. The trace may also be generally planar. In some cases the lower lips and the trace are generally parallel. The generally planar lips of the surface mount resistor may be closer to the trace than the thickness of the surface mount resistor. A single geometric plane may extend through substantially all of the lips and all of the trace. In some cases the lower surface of the lips and the lower surface of the trace are substantially coplanar. In some cases the upper surface of the lower lip and the upper surface of the trace are substantially coplanar. In other cases the lower surface of the lower lip and the lower surface of the trace are substantially coplanar and in addition the upper surface of the lip and the upper surface of the trace are substantially coplanar.

28 Claims, 3 Drawing Sheets

INPUT TRANSIENT PROTECTION FOR ELECTRONIC DEVICES

BACKGROUND OF THE INVENTION

The invention relates to electronic circuit boards and particularly passive means for protecting against voltage transient in electronic components. Alarm systems and many other electronic devices are attached through wires to external devices. These wires are subject to voltage transients that can lead to failure of individual components on the circuit board. The problem is particularly acute with respect to resistors at an input for a given electronic circuit. Wires that are connected to the input for the circuit, referred to as "external wires" have voltage transients in them. The usual failure mode of such resistors is a changing value of the resistor as the transient arcs from the body of the resistor, burning off the film deposited on the resistor.

Although the present invention will be described in terms of resistors on the input of a circuit board, those skilled in the art will recognize that the present invention may be utilized with other resistors as well as other surface mounted passive components such as inductors and capacitors. This is particularly true of such surface mounted components having end caps.

The invention has particular application to intrusion as well as fire/smoke detection alarm systems. Examples of intrusion detection systems include those shown in the following United States patents having the same assignee as the present application:

U.S. Pat. No. 6,593,850 Wireless intrusion detector with test mode issued on Jul. 15, 2003 to Addy.
U.S. Pat. No. 6,188,318 Dual-technology intrusion detector with pet immunity issued on Feb. 13, 2001 to Katz, et al.
U.S. Pat. No. 4,939,359 Intrusion Detection System with Zone Location issued on Jul. 3, 1990 to Freeman.
U.S. Pat. No. 4,614,938 Dual channel pyroelectric intrusion detector issued on Sep. 30, 1986 to Weitman.
U.S. Pat. No. 4,360,905 Intrusion Alarm System for Use with Two-Wire-Cable issued on Nov. 23, 1982 to Hackett.
RE No. 30,288 Intrusion Detection System issued on May 27, 1980 to Hackett.
U.S. Pat. No. 4,035,798 Ultrasonic Intrusion Detection System issued on Jul. 12, 1977 to Hackett.

Examples of such a fire/smoke detection system 14 include the apparatus shown in the following United States patents having the same assignee as the present application:

U.S. Pat. No. 6,150,935 Fire Alarm System With Discrimination Between Smoke And Non-Smoke Phenomena issued on Nov. 21, 2000 to Anderson;
U.S. Pat. No. 6,084,522 Temperature Sensing Wireless Smoke Detector issued on Jul. 4, 2000 to Addy
U.S. Pat. No. 5,781,291 Smoke Detectors Utilizing A Hydrophilic Substance issued on Jul. 14, 1998 to So, et al.
U.S. Pat. No. 5,764,142 Fire Alarm System With Smoke Particle Discrimination issued on Jun. 9, 1998 to Anderson, et al.
U.S. Pat. No. 5,726,633 Apparatus and Method for Discrimination of Fire Types issued on Mar. 10, 1998 to Wiemeyer;
U.S. Pat. No. 5,659,292 Apparatus Including a Fire Sensor and a Non-Fire Sensor issued on Aug. 19, 1997 to Tice.
U.S. Pat. No. 5,633,501 Combination Photoelectric and Ionization Smoke Detector issued on May 27, 1997 to Amieshi, et al.
U.S. Pat. No. 5,557,262 Fire alarm System with Different Types of Sensors and Dynamic System Parameters issued on Sep. 17, 1996 to Tice.
U.S. Pat. No. 5,117,219 Smoke and Fire Detection System Communication issued on May 26, 1992 to Tice, et al.
U.S. Pat. No. 4,916,432 Smoke and Fire Detection System Communication issued on May 26, 1992 to Tice, et al.
U.S. Pat. No. 4,374,329 Smoke Detector with Test Apparatus issued on Feb. 15, 1983 to Schoenfelder, et al.
U.S. Pat. No. 4,316,184 Combination Combustion-Product Detector issued on Feb. 16, 1982 to Nagel.
U.S. Pat. No. 4,225,860 Sensitivity Controlled Dual Input Fire Detector issued on Sep. 30, 1980 to Conforti.
U.S. Pat. No. 4,097,851 Sensitivity Compensated Fire Detector issued on Jun. 27, 1978 to Klein.
U.S. Pat. No. 4,091,363 Self-contained Fire Detector with Interconnection Circuitry issued on May 23, 1978 to Siegel, et al.
U.S. Pat. No. 4,020,479 Fire Detector issued on Apr. 26, 1977 to Conforti, et al.

The disclosures of the above referred to patents are incorporated by reference. Various embodiments of the present invention may utilize different fire and smoke detecting apparatus as well as different intrusion detection and storage apparatus.

A preferred technique for assembling circuit boards involves the use of surface mount components and wave soldering. The invention has particular application to surface mount components such as resistors. One example of a surface mount component is described in U.S. Pat. No. 5,604,477 entitled Surface Mount Resistor and Method for Making Same issued on Feb. 18, 1997. One specific technique for wave soldering is described in U.S. Pat. No. 4,208,002 entitled Wave Soldering System issued on Jun. 17, 1980. The disclosures of these patents are incorporated by reference.

Typically, the components that will tolerate the voltage transients are relatively high cost large axial mount components. Thus, the traditional approach to avoiding the problem increases the cost for the component and increases the cost of assembly by complicating the assembly procedure. Alternatively, relatively expensive transient absorbers such as transorbs or metal oxide varistors (MOV) may be used. Thus, the traditional approaches to solving the problem increase the cost of the product.

SUMMARY OF THE INVENTION

It is an object of invention to minimize the cost of assembling, the cost of the components and simplify the manufacturing process for electronic circuit boards.

It also an object of the present invention to provide apparatus that will allow the use of small low cost surface mount components to replace large axial mount components.

Still another object of the invention is to prevent small inexpensive surface mount components from being destroyed by transients.

It is another object of the invention to provide a passive device which will isolate the internal circuitry of these electronic devices from transients.

It has now been found that these and other objects of the invention may be attained in a circuit board assembly which includes an electrically insulating layer, a conductive printed wiring layer formed on the surface of the electrically insulating layer and including a plurality of conductive paths, a conductive trace on the electrically insulating layer and apparatus for dissipating a transient in addition to a surface mount resistor fixed in relation to the trace.

In some forms of the invention the surface mount resistor has opposed generally planar lips. The surface mount resistor may have generally planar lips and the trace may also be generally planar. In some cases the lower lips and the trace are generally parallel. The generally planar lips of the surface mount resistor may be closer to the trace than the thickness of the surface mount resistor. A single geometric plane may extend through substantially all of the lips and all of the trace. In some cases the lower surface of the lips and the lower surface of the trace are substantially coplanar. In some cases the upper surface of the lower lip and the upper surface of the trace are substantially coplanar. In other cases the lower surface of the lower lip and the lower surface of the trace are substantially coplanar and in addition the upper surface of the lip and the upper surface of the trace are substantially coplanar.

In some cases the surface mount resistor has a height of t and the spacing between the lip and the trace is less than t. In other cases the spacing between the lip and the trace is no more than one half t.

The invention the also includes a circuit protection system which includes a conductive trace and apparatus for dissipating a transient, a surface mount passive component having opposed end caps, each of the end caps includes a lip, each lip is disposed in closely spaced relationship to the conductive trace.

In some cases the lips have respective edges thereof which are mutually parallel. Each lip may be generally planar and the trace may also be generally planar. In some cases the lips and the trace are generally parallel. In other cases an edge of each lip is approximately 0.01 inch from the trace. Each generally planar lip of the surface mount passive component may be closer to the trace than the thickness of the surface mount passive component.

The invention also includes an alarm system that includes a circuit board assembly which includes an electrically insulating layer, a conductive printed layer formed on the surface of the electrically insulating layer and including a plurality of conductive paths, a conductive trace on the electrically insulating layer and apparatus for dissipating a transient, a surface mount resistor fixed in closely spaced relation to the trace.

In some cases the surface mount resistor has opposed generally planar lower lips. The surface mount resistor may have opposed generally planar lower lips and the trace may also be generally planar. In some cases the surface mount resistor has opposed generally planar lower lips, the trace is also generally planar and the lower lips and the trace are generally parallel.

The generally planar lower lips of the surface mount resistor may be closer to the trace than the thickness of the surface mount resistor. The surfaces of the lips and the trace may be parallel. The generally planar lips of the surface mount resistor may be spaced no more than 0.01 inch from the trace.

The invention also includes an electrically insulating layer, a conductive printed wiring layer formed on the surface of the electrically insulating layer and including a plurality of conductive paths, a conductive trace on the electrically insulating layer and apparatus for dissipating a transient, a first surface mount resistor fixed in closely spaced relation to the trace and a second surface mount resistor fixed in closely spaced relation to the trace.

The surface mount resistors may have opposed generally planar lips. Each of the surface mount resistors may have generally planar lips and the trace is also generally planar. In some cases all of the lower lips and the trace are generally parallel. The generally planar lips of the surface mount resistors may be closer to the trace than the thickness of the surface mount resistors.

A single geometric plane may extend through substantially all of the lips and all of the trace. The lower surface of the lips and the lower surface of the trace may be substantially coplanar. The upper surface of the lower lips and the upper surface of the trace may be substantially coplanar. Both the lower surface of the lower lip and the lower surface of the trace may be substantially coplanar and in addition the upper surface of the lips and the upper surface of the trace may be substantially coplanar.

In some cases the surface mount resistor has a height of t and the spacing between each lip and the trace is less than t. In other cases the spacing between each lip and the trace is no more than one half t. In some embodiments of the invention the distance between the first and second resistors is greater than the height of each resistor. In some embodiments the distance between the first and second resistors is at least three times the height of each resistor.

BRIEF DESCRIPTION OF THE DRAWING

The invention will be better understood by reference the accompanying drawing in which.

DESCRIPTION OF THE PREFERRED EMBODIMENTS

Figure 2:
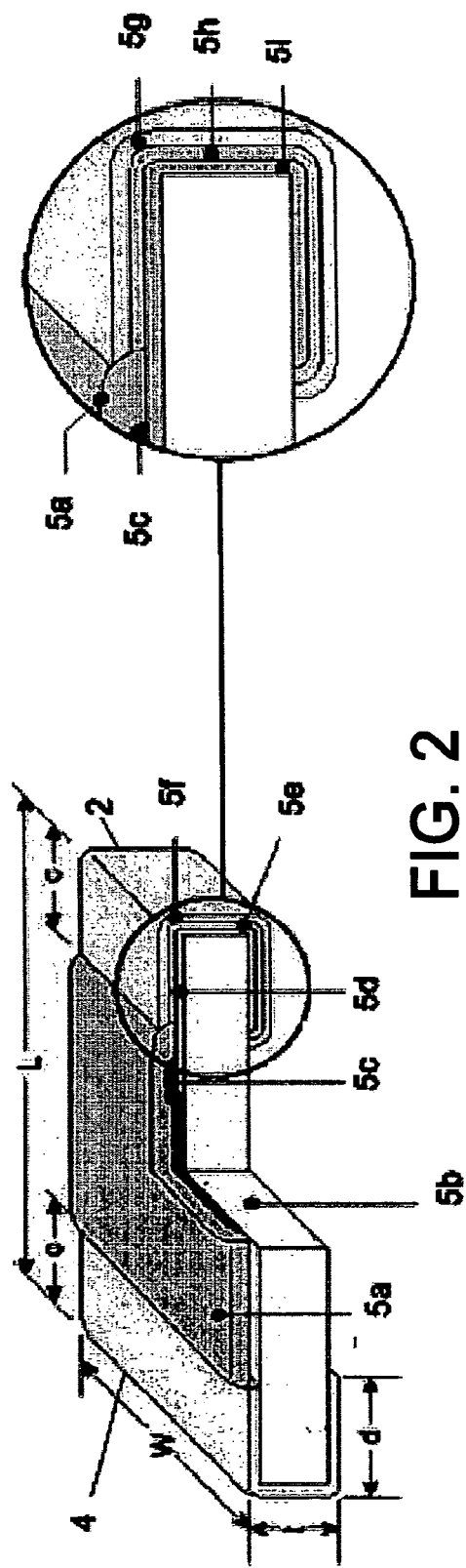
FIG. 2 is a partially schematic, broken away perspective view of a conventional surface mount resistor illustrating a portion with greater detail.
Figure 3:
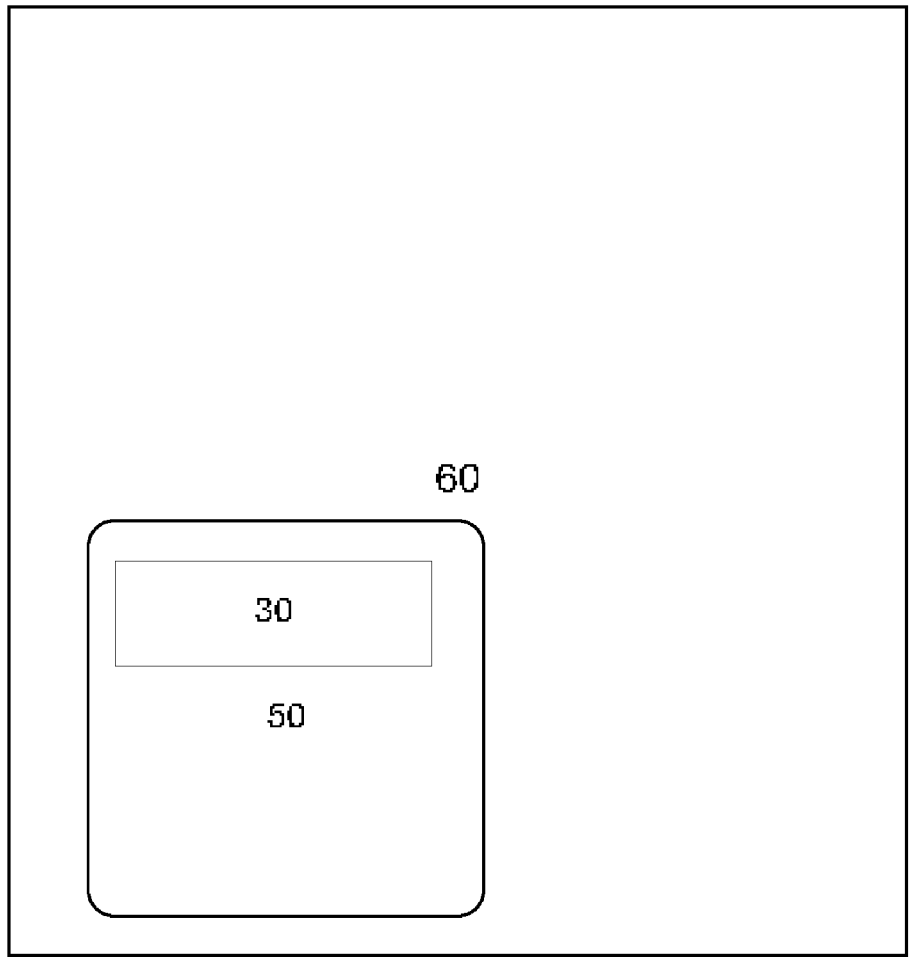
FIG. 3 is a schematic representation of a system 60 incorporating a circuit board 50 on which components 30 are mounted including all of the components shown in FIG. 1.

Referring now to the drawing, there is shown in FIG. 2 a broken away perspective view of a conventional surface mount resistor 1. Such resistors, often called chip resistors, are substantially formed as parallelepipeds, and have generally U-shaped end caps 2, 4. The end caps 2, 4 are typically manufactured to industry-standard specifications. The noted dimensions t for thickness or height as well as other dimensions d, W, and c are controlled during the resistor manufacturing process to insure mounting of the chip resistor on a printed circuit board is facilitated. The lower face of each end cap 2, 4, having the dimension d, registers with associated pads (not shown) on a printed circuit board to which they resistor is ultimately mounted. The conventional surface mount resistor includes a protective coating 5a, ceramic substrate 5b, resistive film 5c, inner electrode 5d, nickel plating 5e, solder plating 5f, nickel plating 5f, termination (outer) 5g, termination (barrier) 5h, and termination (inner) 5i. Wave soldering procedures secure the resistor to the printed circuit board.

Figure 1:
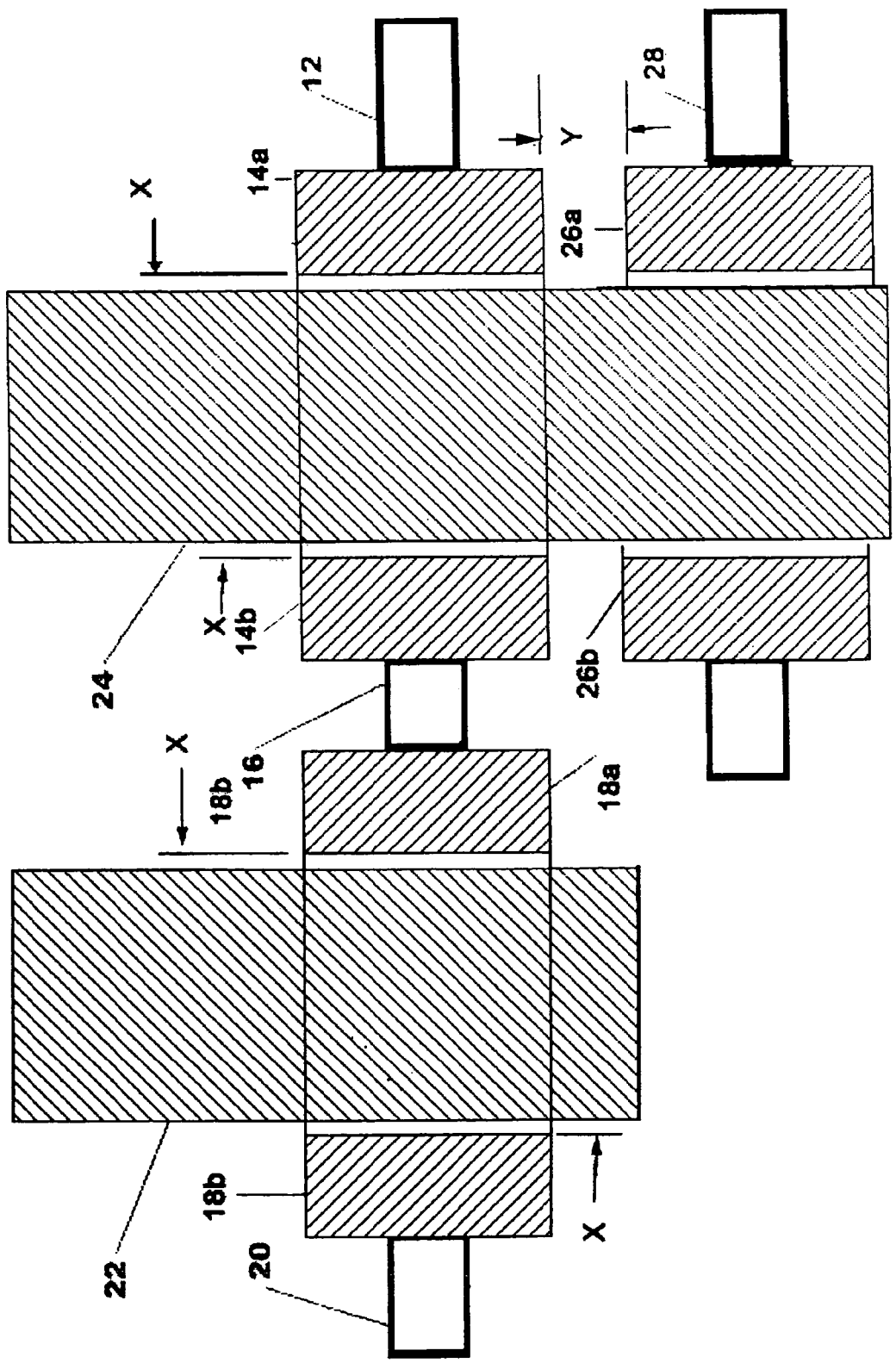
FIG. 1 illustrating schematically a section of three surface mount resistors at the input of an electronic circuit with first and second protective traces disposed to protect the respective surface mount resistors. This view is taken along a plane that is parallel to the upper face of the associated circuit boar and spaced therefrom just sufficiently to clear the pads (not shown) on the printed circuit board that are soldered to the end caps of the resistor.

FIG. 1 illustrates the relationship between first, third and second surface mounted resistors respectively symbolized schematically by end caps 14a and 14b, 18a and 18b and 26a and 26b. and protective traces 22, 24 in accordance with the present invention. More specifically, a first conductor 12 is part of an electronic circuit, such as an electronic security system and is also connected to external circuitry (not shown). It is this first conductor 12 that experiences transients and which is also connected to a first surface mount resistor having respective end caps 14a and 14b. A second conductor 16 connects the first surface mount resistor to a second surface mount resistor having end caps 18a and 18b. A third conductor 20 connects the second surface mount resistor to the internal circuitry of a given system. In addition, a third surface mount resistor having end caps 26a and 26b connects to external circuitry via conductor 28 and internal circuitry via conductor. The system/internal circuitry may be the circuitry of an alarm system located on the same circuit board.

The apparatus and method in accordance with present invention avoids the above-described problems by providing a different path for the transient arc. More specifically, as shown in FIG. 1, a first metal trace 24 is placed under the first surface mounted resistor having end caps 14a, 14b and a third resistor having end caps 26a, 26b. A second metal trace 22 is placed under the second surface mounted resistor having end caps 18a, 18b. Each metal trace is preferably manufactured of the same conductive material as that used in the rest of the printed circuit board. Typically this will be copper although aluminum and other conductive materials may be used. Each metal trace 22, 24 is connected to ground or may be at some potential. It is only essential that the trace 22, 24 as well as connections to the trace 22, 24 be dimensioned and configured to enable the respective trace to dissipate transients without damage to any part of the circuit. In a preferred embodiment each trace 22, 24 is disposed approximately 0.01 inches from the pad of the resistor. This dimension is indicated as "X" in FIG. 1 (4 instances). Accordingly, a transient will arc from the one of the end caps 14a, 14b on the first surface mounted resistor to the trace 24. It is imperative that the dimension X be smaller than the dimension t (the height of the end cap 14a, 14b and essentially the height of the first surface mounted resistor 14). To provide an adequate margin of safety is preferable that the dimension X be less than the dimension t.

Similarly a transient at the third surface mounted resistor will arc to the trace 22 in the manner described above. In each case arcing from the lower faces of the first and third resistors respectively to the traces 22, 24 will occur because the distance is shorter than the distance from the film on top of the resistor body to the ground trace. Ordinarily, the pad or lower face of the respective surface mounted resistors will be planar and the respective traces 22, 24 will also be planar. The precise spacing between the trace and the resistor will vary for different applications. Considerations to be considered in determining the spacing include the physical characteristics of the resistor, the physical characteristics of the trace, and the nature of the transients typically encountered.

It is preferable that the trace, such as the trace 24, be disposed in substantially coplanar relationship with the lower lip of the end caps 2, 4. (It will be the understood that the end caps 2, 4 have a generally U-shaped contour. The lowermost part thereof (as viewed in FIG. 2) is the lower lip that is preferably coplanar with the trace 24.) As used herein, the term "coplanar" means a plane (that is inherently infinitely thin) will extend throughout the entire extent of the lower lips and the trace 24. In a preferred embodiment the lower lips and the trace are both planar and the top surface of the lower lips and the top surface of the trace are coplanar and in addition the bottom surface of the lower lips and the lower surface of the trace are coplanar. Thus, the surface area of the trace 22 exposed to the edge of the lower lip is maximized.

The first and third surface mounted resistors are respectively protected by traces 24, 22. The second surface mounted resistor is protected by the trace 24 which is the same trace that protects the first surface mounted resistor. An additional consideration in the layout occurs in this case. More specifically, the dimension Y (the distance between adjacent end caps on the first surface mounted resistor 14 and the second surface mounted resistor 26) must be even greater than the dimension X. More specifically, it is important that the dimension Y be greater than X and is preferable that they dimension Y be no less than three times the dimension t. Because the transient at the first resistor 14 and the transient at the third resistor 26 may instantaneously be respectively positive and negative the risk of damage (in the risk of an arc from one end cap to another end cap) as the result of the transients is much greater than the case where only one transient is present or even when to transients are both positive or both negative.

In one embodiment of the invention each of the first, second, and third surface mounted resistors is a three quarter watt 2H/2010. The dimension t for this component is 0.024 inch. In a preferred embodiment the dimension X is approximately 0.010 inch. In a preferred embodiment of the dimension Y is at least 0.080 inch. It will thus be seen that a transient will be diverted from the body of the component to elsewhere that will not cause damage. In the case of alarm system is possible to use surface mount components for zone inputs on alarm systems without the addition of expensive transient absorbers.

As used herein the dimension t shown in FIG. 2 is referred to as the height of the resistor. Those skilled in the art will recognize that this measurement is widely used in the industry. Accordingly, for ease of description of the present invention that simplification has been adopted.

Although the present invention has been described in terms of resistors on the input of a circuit board, those skilled in the art will recognize that the present invention may be utilized with other surface mounted passive components such as inductors and capacitors. This is particularly true for such passive components that are constructed with end caps in the manner of the surface mount resistor described above. Although the trace 22, 24 has been referred to as a single band that extends close to opposed edges of respective end caps, it will be understood that alternatively the trace may be formed in two elongated strips.

It will be obvious to those having skill in the art that many changes may be made to the details of the above-described embodiments of this invention without departing from the underlying principles thereof. Accordingly, it will be appreciated that this invention is also applicable to other systems. The scope of this invention should, therefore, be determined only by the following claims.

What is claimed is:

1. A circuit protection system for dissipating transients without the use of transorbs or metal oxide varistors which comprises:
    a printed circuit board;
    a surface mount component mounted on said printed circuit board, said surface component having first and second end caps, said first and second end caps each having a first edge;
    a conductive trace on said printed circuit board having first and second opposed edges extending intermediate said first and second end caps, said first and second opposed edges being coplanar and thereby defining a plane, said plane intersecting said first edge of said first end cap and intersecting said first edge of said second end cap, said first edge of said trace being disposed in parallel spaced relation to said first edge of said first end cap and said second edge of said trace being disposed in parallel spaced relation to said first edge of said second end cap.

2. The circuit protection system as described in claim 1 wherein the dimension of the space intermediate (1) said first edge of said trace and said first edge of said first end cap and (2) said second edge of said trace and said first edge of said second end cap are both substantially equal to X.

3. The circuit protection system as described in claim 2 wherein said surface mount component has a height dimension t and X is less than t.

4. The circuit protection system as described in claim 2 wherein X is approximately 0.01 inch.

5. A circuit protection system for dissipating transients without the use of transorbs or metal oxide varistors which comprises:

a printed circuit board;

a first surface mount component mounted on said printed circuit board, said surface component having first and second end caps, said first and second end caps each having a first edge;

a second surface mount component mounted on said printed circuit board, said surface component having first and second end caps, said first and second end caps each having a first edge;

a conductive trace on said printed circuit board having first and second opposed edges extending intermediate said first and second end caps of said first surface mounted component, said first and second opposed edges being coplanar and thereby defining a plane, said plane intersecting said first edge of said first end cap of said first surface mounted component and intersecting said first edge of said second end cap of said first surface mounted component, said first edge of said trace being disposed in parallel spaced relation to said first edge of said first end cap of said first surface mounted component and said second edge of said trace is disposed in parallel spaced relation to said first edge of said second end cap of said first surface mounted component; and said conductive trace on said printed circuit board having said first and second opposed edges extending intermediate said first and second end caps of said second surface mounted component, said plane intersecting said first edge of said first end cap of said second surface mounted component and intersecting said first edge of said second end cap of said second surface mounted component, said first edge of said trace being disposed in parallel spaced relation to said first edge of said first end cap of said second surface mounted component and said second edge of said trace being disposed in parallel spaced relation to said first edge of said second end cap of said second surface mounted component.

6. The circuit protection system as described in claim 5 wherein dimension of the space intermediate (1) said first edge of said trace and said first edge of said first end cap of said first surface mounted component and (2) said second edge of said trace and said first edge of said second end cap of said first surface mounted component, (3) said first edge of said trace and said first edge of said first end cap of said second surface mounted component and (4) said second edge of said trace and said first edge of said second end cap of said second surface mounted component are all substantially equal to X.

7. The circuit protection system as described in claim 4 wherein said surface mount component has a height dimension t and X is less than t.

8. The circuit protection system as described in claim 6 wherein X is approximately 0.01 inch.

9. The circuit protection system as described in claim 6 wherein the minimum spacing between the respective end caps of said first and second surface mounted components is at least three times the dimension X.

10. A circuit protection system for dissipating transients without the use of transorbs or metal oxide varistors which comprises:

a printed circuit board;

a first surface mount component mounted on said printed circuit board, said surface component having first and second end caps, said first and second end caps each having a first edge;

a second surface mount component mounted on said printed circuit board, said surface component having first and second end caps, said first and second end caps each having a first edge;

a first conductive trace on said printed circuit board having first and second opposed edges extending intermediate said first and second end caps of said first surface mounted component, said first and second opposed edges being coplanar and thereby defining a plane, said plane intersecting said first edge of said first end cap of said first surface mounted component and intersecting said first edge of said second end cap of said first surface mounted component, said first edge of said first trace being disposed in parallel spaced relation to said first edge of said first end cap of said first surface mounted component and said second edge of said first trace being disposed in parallel spaced relation to said first edge of said second end cap of said first surface mounted component;

said first conductive trace on said printed circuit board having said first and second opposed edges extending intermediate said first and second end caps of said second surface mounted component, said plane intersecting said first edge of said first end cap of said second surface mounted component and intersecting said first edge of said second end cap of said second surface mounted component, said first edge of said first trace being disposed in parallel spaced relation to said first edge of said first end cap of said second surface mounted component and said second edge of said first trace being disposed in parallel spaced relation to said first edge of said second end cap of said second surface mounted component;

a third surface mount component mounted on said printed circuit board, said third surface component having first and second end caps, said first and second end caps each having a first edge;

a second conductive trace on said printed circuit board having first and second opposed edges extending intermediate said first and second end caps of said third surface mount component, said first and second opposed edges of said second conductive trace being coplanar and thereby defining a plane, said plane intersecting said first edge of said first end cap of said third surface mount component and intersecting said first edge of said second end cap of said third surface mount component, said first edge of said second trace being disposed in parallel spaced relation to said first edge of said first end cap of said third surface mount component and said second edge of said second trace being disposed in parallel spaced relation to said first edge of said second end cap of said third surface mount component.

11. The circuit protection system as described in claim 10 wherein dimension of the space intermediate (1) said first edge of said first trace and said first edge of said first end cap of said first surface mounted component, (2) said second edge of said first trace and said first edge of said second end cap of said first surface mounted component, (3) said first edge of said first trace and said first edge of said first end cap of said second surface mounted component and (4) said second edge of said first trace and said first edge of said second end cap of said second surface mounted component are all equal to X, (5) said first edge of said second trace and said first edge of said first end cap of said third surface mounted component, and (6) said second edge of said second trace and said first edge of said second end cap of said third surface mounted component are all substantially equal to X.

12. The circuit protection system as described in claim 10 wherein the minimum spacing between the respective end caps of said first and second surface mounted components is at least three times the dimension X.

13. The circuit protection system as described in claim 10 wherein the minimum spacing between the respective end caps of said first and second surface mounted resistors is at least three times the dimension X.

14. The circuit protection system as described in claim 11 wherein each surface mount component has a height dimension t and X is less than t.

15. The circuit protection system as described in claim 11 wherein X is approximately 0.01 inch.

16. A circuit protection system for dissipating transients without the use of transorbs or metal oxide varistors which comprises:
a printed circuit board;
a surface mount resistor mounted on said printed circuit board, said surface resistor having first and second end caps, said first and second end caps each having a first edge;
a conductive trace on said printed circuit board having first and second opposed edges extending intermediate said first and second end caps, said first and second opposed edges being coplanar and thereby defining a plane, said plane intersecting said first edge of said first end cap and intersecting said first edge of said second end cap, said first edge of said trace being disposed in parallel spaced relation to said first edge of said first end cap and said second edge of said trace being disposed in parallel spaced relation to said first edge of said second end cap.

17. The circuit protection system as described in claim 16 wherein dimension of the space intermediate (1) said first edge of said trace and said first edge of said first end cap and (2) said second edge of said trace and said first edge of said second end cap are both substantially equal to X.

18. The circuit protection system as described in claim 17 wherein said surface mount resistor has a height dimension t and X is less than t.

19. The circuit protection system as described in claim 18 wherein X is approximately 0.01 inch.

20. A circuit protection system for dissipating transients without the use of transorbs or metal oxide varistors which comprises:
a printed circuit board;
a first surface mount resistor mounted on said printed circuit board, said surface resistor having first and second end caps, said first and second end caps each having a first edge;
a second surface mount resistor mounted on said printed circuit board, said surface resistor having first and second end caps, said first and second end caps each having a first edge;
a conductive trace on said printed circuit board having first and second opposed edges extending intermediate said first and second end caps of said first surface mounted resistor, said first and second opposed edges being coplanar and thereby defining a plane, said plane intersecting said first edge of said first end cap of said first surface mounted resistor and intersecting said first edge of said second end cap of said first surface mounted resistor, said first edge of said trace being disposed in parallel spaced relation to said first edge of said first end cap of said first surface mounted resistor and said second edge of said trace is disposed in parallel spaced relation to said first edge of said second end cap of said first surface mounted resistor; and
said conductive trace on said printed circuit board having said first and second opposed edges extending intermediate said first and second end caps of said second surface mounted resistor, said plane intersecting said first edge of said first end cap of said second surface mounted resistor and intersecting said first edge of said second end cap of said second surface mounted resistor, said first edge of said trace being disposed in parallel spaced relation to said first edge of said first end cap of said second surface mounted resistor and said second edge of said trace being disposed in parallel spaced relation to said first edge of said second end cap of said second surface mounted resistor.

21. The circuit protection system as described in claim 20 wherein dimension of the space intermediate (1) said first edge of said trace and said first edge of said first end cap of said first surface mounted resistor and (2) said second edge of said trace and said first edge of said second end cap of said first surface mounted resistor, (3) said first edge of said trace and said first edge of said first end cap of said second surface mounted resistor and (4) said second edge of said trace and said first edge of said second end cap of said second surface mounted resistor are all substantially equal to X.

22. The circuit protection system as described in claim 21 wherein said surface mount resistor has a height dimension t and X is less than t.

23. The circuit protection system as described in claim 21 wherein the minimum spacing between the respective end caps of said first and second surface mounted resistors is at least three times the dimension X.

24. The circuit protection system as described in claim 22 wherein X is approximately 0.01 inch.

25. A circuit protection system for dissipating transients without the use of transorbs or metal oxide varistors which comprises:
a printed circuit board;
a first surface mount resistor mounted on said printed circuit board, said surface resistor having first and second end caps, said first and second end caps each having a first edge;
a second surface mount resistor mounted on said printed circuit board, said surface resistor having first and second end caps, said first and second end caps each having a first edge;
a first conductive trace on said printed circuit board having first and second opposed edges extending intermediate said first and second end caps of said first surface mounted resistor, said first and second opposed edges being coplanar and thereby defining a plane, said plane intersecting said first edge of said first end cap of said first surface mounted resistor and intersecting said first edge of said second end cap of said first surface mounted resistor, said first edge of said first trace being disposed in parallel spaced relation to said first edge of said first end cap of said first surface mounted resistor and said second edge of said first trace being disposed in parallel spaced relation to said first edge of said second end cap of said first surface mounted resistor;

said first conductive trace on said printed circuit board having said first and second opposed edges extending intermediate said first and second end caps of said second surface mounted resistor, said plane intersecting said first edge of said first end cap of said second surface mounted resistor and intersecting said first edge of said second end cap of said second surface mounted resistor, said first edge of said first trace being disposed in parallel spaced relation to said first edge of said first end cap of said second surface mounted resistor and said second edge of said first trace being disposed in parallel spaced relation to said first edge of said second end cap of said second surface mounted resistor;

a third surface mount resistor mounted on said printed circuit board, said third surface resistor having first and second end caps, said first and second end caps each having a first edge;

a second conductive trace on said printed circuit board having first and second opposed edges extending intermediate said first and second end caps of said third surface mount resistor, said first and second opposed edges of said second conductive trace being coplanar and thereby defining a plane, said plane intersecting said first edge of said first end cap of said third surface mount resistor and intersecting said first edge of said second end cap of said third surface mount resistor, said first edge of said second trace being disposed in parallel spaced relation to said first edge of said first end cap of said third surface mount resistor and said second edge of said second trace being disposed in parallel spaced relation to said first edge of said second end cap of said third surface mount resistor.

26. The circuit protection system as described in claim 25 wherein dimension of the space intermediate (1) said first edge of said first trace and said first edge of said first end cap of said first surface mounted resistor, (2) said second edge of said first trace and said first edge of said second end cap of said first surface mounted resistor, (3) said first edge of said first trace and said first edge of said first end cap of said second surface mounted resistor and (4) said second edge of said first trace and said first edge of said second end cap of said second surface mounted resistor are all equal to X, (5) said first edge of said second trace and said first edge of said first end cap of said third surface mounted resistor, and (6) said second edge of said second trace and said first edge of said second end cap of said third surface mounted resistor are all substantially equal to X.

27. The circuit protection system as described in claim 26 wherein each surface mount resistor has a height dimension t and X is less than t.

28. The circuit protection system as described in claim 26 wherein X is approximately 0.01 inch.

* * * * *